United States Patent [19]

Usui

[11] Patent Number: 5,203,032
[45] Date of Patent: Apr. 13, 1993

[54] STATION SELECTING APPARATUS

[75] Inventor: Akira Usui, Takatsuki, Japan

[73] Assignee: Matsushita Electric Industrial Co., Ltd., Osaka, Japan

[21] Appl. No.: 547,152

[22] Filed: Jul. 3, 1990

[30] Foreign Application Priority Data

Jul. 5, 1989 [JP] Japan .................. 1-173400

[51] Int. Cl.$^5$ ............................................. H04B 1/16
[52] U.S. Cl. ............................. 455/182.2; 455/192.2; 455/209; 455/316
[58] Field of Search ............... 455/182, 192, 209, 260, 455/264, 314–317, 182.1, 182.2, 182.3, 192.1, 192.2, 192.3; 358/195.2

[56] References Cited

U.S. PATENT DOCUMENTS

| 4,814,887 | 3/1989 | Marz et al. | 455/192 |
| 4,823,399 | 4/1989 | George | 455/192 |
| 4,855,835 | 8/1989 | Tobita | 455/192 |
| 4,928,314 | 5/1990 | Grandfield | 455/317 |

FOREIGN PATENT DOCUMENTS 0124332 11/1984 European Pat. Off.
60-204113 2/1986 Japan.

Primary Examiner—Reinhard J. Eisenzopf
Assistant Examiner—Edward Urban
Attorney, Agent, or Firm—Wenderoth, Lind & Ponack

[57] ABSTRACT

A station selecting station apparatus has a first mixer and a first local oscillation circuit for frequency converting the input signals (television signals) into a first intermediate frequency signal, a second mixer and a second local oscillation circuit for frequency converting the first intermediate frequency signal into the second intermediate frequency signal. A variable voltage device capable of varying and outputting by stages the direct current fixed voltage as the signal for controlling the second local oscillator is provided, the minimum potential width of the direct current fixed voltage is set so that the frequency displacement (unit variation amount) of the second local oscillator obtained by the potential difference is smaller than the frequency resolution of the first local oscillator.

3 Claims, 2 Drawing Sheets

STATION SELECTING APPARATUS

BACKGROUND OF THE INVENTION

The present invention generally relates to a station selecting apparatus which has at least two local oscillators, such as an up/down tuner station selecting apparatus and so on to be used in, for example, a CATV and so on.

Generally, in, for example, a CATV in America, since the frequency zone thereof ranges to 54 through 440 MHz, a station selecting apparatus of a double superheterodyne type is normally used. The station selecting apparatus of a double superheterodyne type is also called an up/down tuner. It converts a received high-frequency signal into a first intermediate frequency signal by the conversion from the upper side station so as to attenuate the image interference signal, and thereafter, it converts it into a second intermediate frequency signal free from the image interferences by the conversion from the lower side station. The basic construction of such a station selecting apparatus is shown in FIG. 2.

One example of the conventional station selecting apparatus will be described hereinafter in accordance with the drawings.

FIG. 2 is a block diagram of the conventional station selecting apparatus.

Television signals, for example, VHF or UHF inputted from the input terminal a are amplified by a pre-amplifier 1 and are fed into a first mixer 2. The first mixer 2 mixes the input television signal with the oscillation output signal of the first local oscillator 6. The frequency is converted by the conversion from the upper side station into the first intermediate frequency such as a first intermediate frequency signal of 965 MHz, and is fed into the first intermediate frequency amplifier 3.

The first local oscillator 6 is composed of a voltage control type of oscillator (VCO) of, for example, 1 through 2 GH in oscillation frequency. The oscillation output signal is divided in frequency by a pre-frequency-divider 12. The frequency division output signal is inputted into a variable frequency divider 13 from the terminal b, and is variably divided in frequency by the variable frequency divider 13. The first control signal, which contains the channel information, is added to the variable frequency divider 13 by a microcomputer (not shown). The variable frequency divider 13 changes its frequency division ratio in accordance with the first control signal. The output signal of the variable frequency divider 13 is added to a phase comparator 10 as one input signal. The output signal with the reference oscillation frequency signal caused by the crystal oscillation circuit 8 being divided in frequency by the reference frequency divider 9, and the output signal of the variable frequency divider 13 are compared in phase by the phase comparator 10. The detection output signal of a phase comparator 10 is inputted into the first local oscillator 6 from the terminal c through a loss-pass filter 11, and is controlled in frequency. Namely, the oscillation frequency of the first local oscillator 6 is controlled the oscillation frequency in accordance with the channel information. The frequency division ratio of the variable frequency divider 13 is set so that the oscillation frequency of the first local oscillator 6 may become higher by the first intermediate frequency than the frequency of the input television signal.

The output signal of the first mixer 2 is amplified by the first intermediate amplifier 3, and has the image interference removed, and is fed into the second mixer. It is mixed with the oscillation output signal of the second local oscillator 7, and is converted into the second intermediate frequency signal of, for example, 58.75 MHz by the conversion from the lower side station. The signal from the mixer 4 is inputted into the second intermediate frequency amplifier 5, is amplified, and thereafter, is outputted from the terminal e. Also, the second intermediate frequency signal which is the output of the second intermediate frequency amplifier 5 is fed into the AFC (Automatic Frequency Control) detector 14 from the terminal e. Either one of the detection output signals of the AFC detector 14 is selected with respect to the fixed voltage V by the switch circuit 16, and is inputted into the second local oscillator 7 from the terminal d through the low-pass filter 15, and is controls the oscillation frequency of the second local oscillator 7. The second control signal is adapted to control a switch circuit 16. When the power supply has been turned on or off or the channel has been changed, the fixed voltage V is outputted into the low-pass filter 15. Except for it, the output signal of the AFC detector 14 is adapted to be outputted into the low-pass filter 15. This is a known art of preventing the operation errors at the channel switching time or the like.

Namely, in the circuit of FIG. 2, by the first local oscillator 6 and the first mixer 2 composing a PLL (Phase Locked Loop) circuit, the first control signal is changed so as to change the frequency of the signal from the first local oscillator 6; a high frequency signal to be converted into the first intermediate frequency signal is selected to be tuned into the signal of a particular frequency (television signal of the channel to be selected) to have the channel selecting station and also, to effect the up conversion. The down conversion is effected by the second local oscillator 7 and the second mixer 4 for the operation of the AFC function. It is to be noted that in FIG. 2, the block surrounded with the broken points show a tuner housing member.

In the circuit of FIG. 2, there may be a case wherein the television signal may be inputted in a condition where it is shifted from the normal frequency. In this case, the oscillation frequency of the first local oscillator has to be controlled so that the frequency of the output signal of the first mixer 2 may become 965 MHZ.

A detuning resolution frequency of the first local oscillator 6 is determined by the product of a fixed resolution (frequency division ratio) and the output signal frequency of the reference frequency divider 9. Assume that the frequency division ratio of the pre-frequency-divider 12 is 1/64, the frequency of the output signal of the reference frequency divider 9 is 1 KHz, and the detuning resolution frequency of the first local oscillator 6, namely, the variation in the oscillation frequency due to the change by one step of the frequency division ratio in the movable frequency divider 13, becomes 64 KHz. Therefore, the first local oscillator 6 changes in frequency at 64 KHz steps, so that a sufficient fine adjustment cannot be effected in the channel setting.

It is considered to set the output signal frequency of the reference frequency divider 9 at a lower frequency in order to make the detuning resolution frequency smaller. But the capacity of the capacitor of the low-pass filter 11 must then be larger, with a problem that the cost of the low-pass filter 11 becomes higher and the response characteristics become worse.

SUMMARY OF THE INVENTION

Accordingly, an object of the present invention has been developed with a view to substantially eliminating the above discussed drawbacks.

Another important object of the present invention is to provide a station selecting apparatus which is capable of making a detuning resolution frequency smaller.

In accomplishing these and other objects, according to one preferred embodiment of the present invention, there is provided a station selecting apparatus which frequency-converts the input signals into the first intermediate frequency signal by a first mixer and a first local oscillator to be frequency controlled by a phase locked loop system, frequency-converts the first intermediate frequency signal into the second intermediate frequency signal by the second mixer and the second local oscillator, and which is characterized in that a detector which detects the second intermediate frequency signal to form the control signal of the second local oscillator, a variable voltage device capable of varying and outputting the direct current fixed voltage by stages, a switching circuit for switching the output control signal of the detector with the direct current fixed voltage of the output signal of the variable voltage device so as to output it into the second local oscillator, the minimum potential width of the variable direct current fixed voltage is set so that the frequency displacement (unit variation amount) of the second local oscillator to be obtained by the potential difference becomes smaller than the frequency resolution of the first local oscillator.

By the above described construction, when the oscillation frequency of the first local oscillator is detuned, the control voltage of the second local oscillator is switched into the direct current fixed voltage of the variable voltage device, a certain direct current fixed voltage is supplied the second local oscillator, the oscillation frequency of the first local oscillator is shifted higher by resolution to be controlled by the PLL system, and at the same time, the direct current fixed voltage of the variable voltage device is lowered by one stage to control the oscillation frequency of the second local oscillator, the direct current fixed voltage of the variable voltage device is restored to the original at the next step, thereafter again the oscillation frequency of the first local oscillator is shifted higher by resolution to be controlled by the PLL system. The operation is repeated to effect the detuning station selecting operation higher in resolution.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
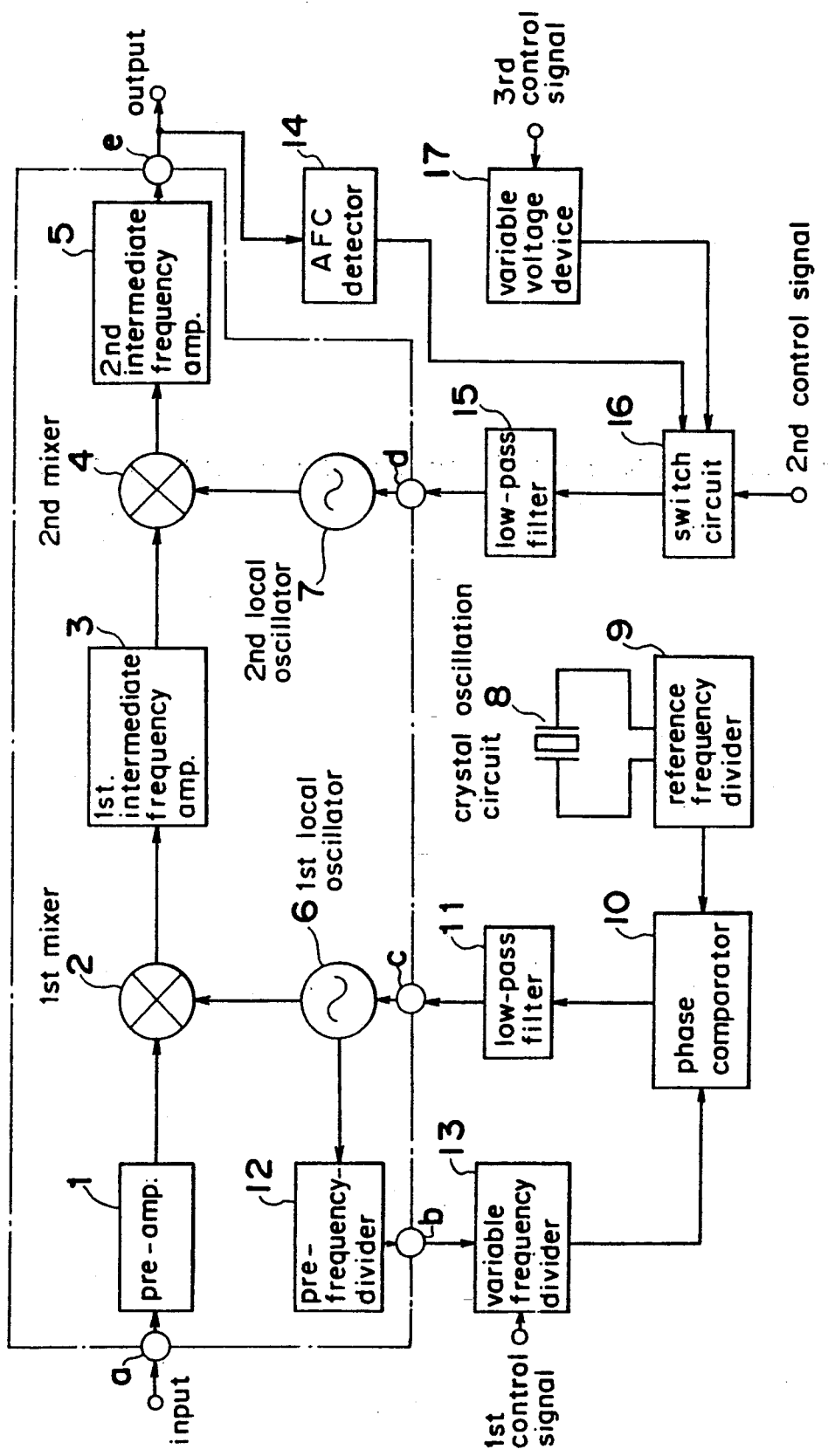
FIG. 1 is a block diagram of a station selecting apparatus in accordance with one embodiment of the present invention.

Before the description of the present invention proceeds and it is to be noted that like parts are designated by like reference numerals throughout the accompanying drawings.

Figure 2:
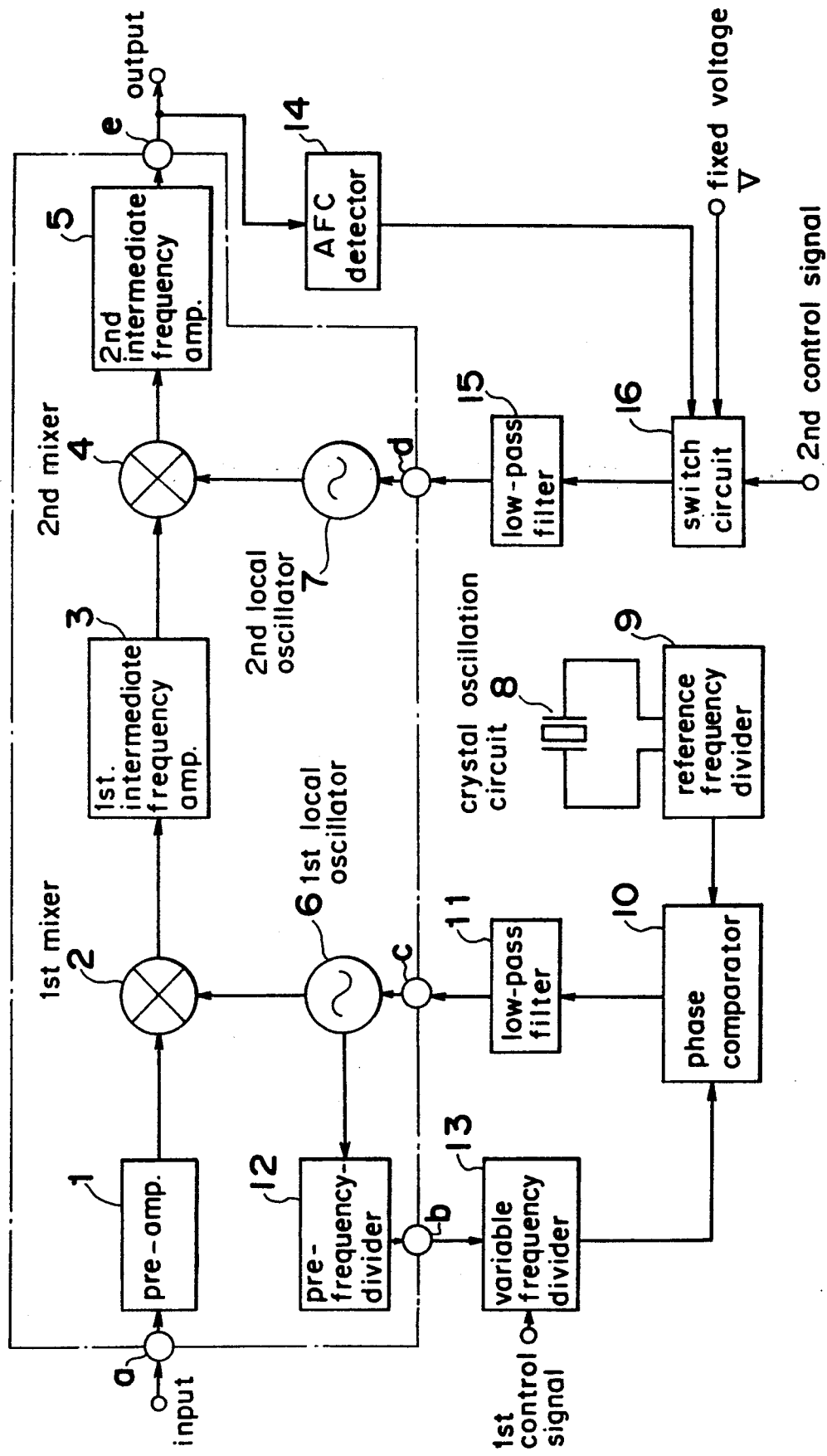
FIG. 2 is a block diagram of the conventional station selecting apparatus.

The station selecting apparatus of the present invention is constructed as almost identical to the conventional one of FIG. 2, as shown with a block diagram of FIG. 1, which comprises a pre-amplifier 1, a first mixer 2, a first intermediate frequency 3, a second mixer 4, a second intermediate frequency amplifier 5, a first local oscillator 6, a second local oscillator 7, a crystal oscillation circuit 8, a reference frequency divider 9, a phase comparator 10, a low-pass filter 11, a pre-frequency-divider 12, a variable frequency divider 13, an AFC detector 14, a low-pass filter 15, a switch circuit 16, and terminals of an input, an output, a first control signal and a second control signal, of which the construction and operations are eliminated because of being identical to those of FIG. 2.

The station selecting apparatus of the present invention has a variable voltage device 17, with the direct current voltage being varied in two stages or more and outputted by the third control signal (generating means is not shown), added to the construction of FIG. 2 of the conventional embodiment, so that the output signal of the variable voltage device 17 is adapted to be inputted into the switch circuit 16. The minimum potential width of the direct current voltage to be varied and outputted by stages from the variable voltage device 17 is set so that the oscillation frequency displacement of the second local oscillator 7 to be obtained by the potential difference may become smaller than the oscillation frequency resolution of the first local oscillator 6. When the third control signal is supplied to the variable voltage device 17, the second control signal (generating means is not shown) automatically controls the switch circuit 16 so that the output signal of the variable voltage device 17 may be outputted into the low-pass filter 15. It is to be noted that in the drawing, the broken lines show the tuner housing member.

In the station selecting apparatus of the present embodiment constructed as described hereinabove, the operation in a case where the detuning is effected will be described hereinafter.

Assume that the resolution frequency of the first local oscillator 6 is 64 KHz. Also, in the second local oscillator 7, if the output direct current voltage of the variable voltage device 17 is changed by one stage (unit variation amount of the oscillation frequency by the variation of one step of the frequency division ratio in the variable frequency divider 13), then the oscillation frequency is varied by 32 KHz.

Assume that the output direct current voltage of the variable voltage device 17 is a first fixed voltage by the third control signal. The switch circuit 16 is controlled by the second control signal so as to feed the output direct current voltage of the variable voltage device 17 into the second local oscillator 7 through the low-pass filter 15.

By the phase synchronizing (phased locked loop: PLL) control, the oscillation frequency of the first local oscillator 6 is shifted higher by 64 KHz in resolution frequency from this condition, and simultaneously, the output direct current voltage of the variable voltage device 17 is lowered by one stage from the first fixed voltage so as to lower by 32 KHz the oscillation frequency of the second local oscillator 7 as the second fixed voltage. At the next step, return the output direct current voltage of the variable voltage device 17 into the original first fixed voltage. Again the oscillation frequency of the first local oscillator 6 is shifted higher by resolution frequency (64 KHz) by the above described PLL control. The user manually operates (operating means is not shown), for example, the third control signal generating means, watching the television picture face. The user repeats the operation, stops the operation at the most proper place (where the noise is then least) of the detuning condition, so that the detuning characteristics may be obtained in the place where the resolution is higher than before (two times in the present example), with a result that the station selecting apparatus which is smaller in the detuning resolution frequency may be obtained. Also, when the oscillation frequency of the first local oscillator 6 is shifted lower, it is better to prepare the third fixed voltage higher by one stage than the first fixed voltage so that the output direct current voltage may be changed between the first fixed voltage and the third fixed voltage.

According to the construction of the present embodiment, the minimum potential width of the direct current voltage stage to be varied and outputted by stages of the variable voltage device is set so that the frequency displacement of the second local oscillator to be obtained by the potential difference may become smaller than the frequency resolution of the first local oscillator, so that the detuning characteristics higher in resolution may be obtained, and the station selecting apparatus which is smaller in the detuning resolution frequency may be provided.

The generating means of the second and third control signal (not shown) is composed of a microcomputer and so on. The third control signal operatively cooperates with the mode to be inputted into the variable voltage device 17. The switch circuit 16 is adapted to automatically select the output signal of the variable voltage device 17 by the second control signal so as to output it into the low-pass filter 15.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:
1. A tuner station selecting apparatus comprising;
    a first mixer for converting the frequency of an input signal into a first intermediate frequency with a first local oscillator;
    a second mixer for converting an output signal from said first mixer into a second intermediate frequency in with a second local oscillator;
    said first mixer comprising:
    a first frequency convertor for inputting both of an output signal from said first local oscillator and said input signal;
    a prefix frequency divider for dividing said output signal from said first local oscillator;
    a variable frequency divider connected to an output terminal of said prefix frequency divider to change the frequency dividing ratio in accordance with channel information input thereto;
    a phase comparator for comparing in phase an output signal of said variable frequency divider and an output signal from a reference frequency divider, and
    a low-pass filter for supplying an output signal from said phase comparator to said first local oscillator as an oscillation control voltage upon changing said output signal of said phase comparator to a direct current;
    a wave detector for detecting an output signal from said second mixer to provide a control signal for said second local oscillator;
    a variable voltage device adapted to output a variable output of direct current voltage step by step, and control signal from said wave detector and said output direct current voltage from said variable voltage device to output one of them to said second local oscillator;
    wherein a minimum electrical potential width at the step of the output direct current voltage being set to a value such that the frequency electrical potential of said second local oscillator obtained by the minimum electrical potential difference is small than a frequency resolution of said first local oscillator.

2. A tuner station selecting apparatus as defined in claim 1, wherein said switch circuit is operated together with a mode for outputting variably said output direct current voltage from said variable voltage device to change automatically to supply said output direct current voltage of said variable voltage device to said second local oscillator.

3. In a tuner station selecting apparatus comprising:
    a first mixer for mixing output signals from a first local oscillator with input signals;
    a first intermediate frequency amplifier for amplifying output signals of said first mixer;
    a second mixer for mixing output signals from a second local oscillator with signals from said first intermediate frequency amplifier;
    a second intermediate amplifier for amplifying output signals of said second mixer;
    a PLL circuit having a first pre-frequency-divider for receiving said output signal of said first local oscillator; a first variable frequency divider of receiving signals from said first pre-frequency-divider; wherein a frequency division ratio of said divider variable; a first phase comparator for receiving output signals of said first variable frequency divider and reference frequency signals; and a first low-pass filter for generating a control voltage for controlling said first local oscillator from output signals of said first phase comparator; a detector for detecting output signal of said second mixer so as to output control signals for said second local oscillator; the improvement comprising:
    a variable voltage device capable of varying and outputting a direct current voltage by stage;
    a switch circuit for switching said control signal from the detector with an output signal of the variable voltage device to output it; a low-pass filter for generating a control voltage for controlling said second local oscillator from said output signal of the switch circuit;
    wherein a minimum potential width of said variable direct current voltage of said output signal of said variable voltage device is set so that a frequency displacement of said second local oscillator obtained by a potential difference is smaller than a frequency resolution of said first local oscillator.
* * * * *